(12) United States Patent
Hsieh et al.

(10) Patent No.: US 11,828,780 B1
(45) Date of Patent: Nov. 28, 2023

(54) CAPACITANCE MONITORING CIRCUIT FOR POWER BACKUP SYSTEMS

(71) Applicant: ZT Group Int'l, Inc., Secaucus, NJ (US)

(72) Inventors: Yung-Tsung Hsieh, Secaucus, NJ (US); Chi-Lin Chiu, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 131 days.

(21) Appl. No.: 17/354,274

(22) Filed: Jun. 22, 2021

(51) Int. Cl.
  *G01R 27/26* (2006.01)
  *G01D 5/24* (2006.01)
  *G01R 1/30* (2006.01)

(52) U.S. Cl.
  CPC ........... *G01R 27/2605* (2013.01); *G01D 5/24* (2013.01); *G01R 1/30* (2013.01)

(58) Field of Classification Search
  CPC ......... G01R 27/2605; G01R 1/30; G01D 5/24
  See application file for complete search history.

(56) References Cited

U.S. PATENT DOCUMENTS

| | | | |
|---|---|---|---|
| 11,316,509 B1* | 4/2022 | Hsieh | H03K 17/145 |
| 2007/0047100 A1* | 3/2007 | Takahashi | H02J 9/061 |
| | | | 359/689 |
| 2012/0161792 A1* | 6/2012 | Ikeda | G06V 40/1306 |
| | | | 324/658 |

* cited by examiner

*Primary Examiner* — Amy He
(74) *Attorney, Agent, or Firm* — Dergosits & Noah LLP; Todd A. Noah

(57) ABSTRACT

Systems and methods are described for reporting capacitance of a capacitor of a power backup circuit comprising a plurality of metal-oxide-semiconductor field-effect transistors (MOSFETs). The system may also include a bleeder resistor and a voltage detection circuit. When capacitance monitoring is active, a first MOSFET may be turned off, causing the capacitor to be discharged via the bleeder resistor. After predetermined time intervals, a first drain voltage and a second drain voltage of the first MOSFET may be determined using the voltage detection circuit. The drain voltage readings at the different times may be used to determine the capacitance of the capacitor, which may be used to generate and transmit a report on capacitor performance and status.

14 Claims, 8 Drawing Sheets

US 11,828,780 B1

CAPACITANCE MONITORING CIRCUIT FOR POWER BACKUP SYSTEMS

TECHNICAL FIELD

Embodiments herein relate generally to power backup circuits, and more specifically to monitoring capacitance of capacitors with high voltage design using a circuit, such that performance for the power backup circuits can be better ensured against capacitor decay and other performance degradation.

SUMMARY OF THE INVENTION

Systems and methods are described for reporting capacitance of a capacitor of a power backup circuit comprising a plurality of metal-oxide-semiconductor field-effect transistors (MOSFETs). The system may also include capacitance-monitoring circuit that includes a bleeder resistor coupled to both the capacitor and a first MOSFET and a voltage detection circuit also coupled to the first MOSFET. A signal may be received by a capacitance-monitoring circuit that activates capacitance monitoring. When capacitance monitoring is active, the first MOSFET may be turned off, causing the capacitor to be discharged via the bleeder resistor. After a predetermined first time interval, a first drain voltage of the first MOSFET may be determined using the voltage detection circuit. Then, after a predetermined second time interval, a second drain voltage may be determined using the voltage detection circuit. The drain voltage readings at the different times may be used to determine the capacitance of the capacitor, which may be used to generate and transmit a report on capacitor performance and status.

In addition to the foregoing, other embodiments are described. These embodiments include using a second MOSFET of the capacitance-monitoring circuit to receive control signals from a control circuit to control the monitoring process. Another embodiment turns off capacitance monitoring in response to receiving a signal indicating a power loss event. A further embodiment utilizes the capacitance-monitoring circuit during the initial charging of the capacitor to provide a two-step ramp-up to a target voltage for power backup.

BRIEF DESCRIPTION OF THE FIGURES

This disclosure is illustrated by way of example and not limitation in the figures of the accompanying drawings, in which like references indicate similar elements, and in which.

DETAILED DESCRIPTION

Many high-reliability systems utilize a short term power backup mechanism for use when the main power fails. For an example, a server system in a bank needs to record currency trading information within a limited time of a main power interruption. Conventional power backup solutions often use an aluminium electrolytic capacitor bank with high voltage design for reducing the capacitor capacitance to meet the system power consumption and hold-up time requirement. But there is no any functions and mechanisms to monitor the aluminium electrolytic capacitor capacitance or an open circuit failure. Once the capacitor capacitance has decayed less than design expected value or an open circuit failure, the power backup solution cannot meet the system power consumption and hold-up time requirement.

Figure 1:
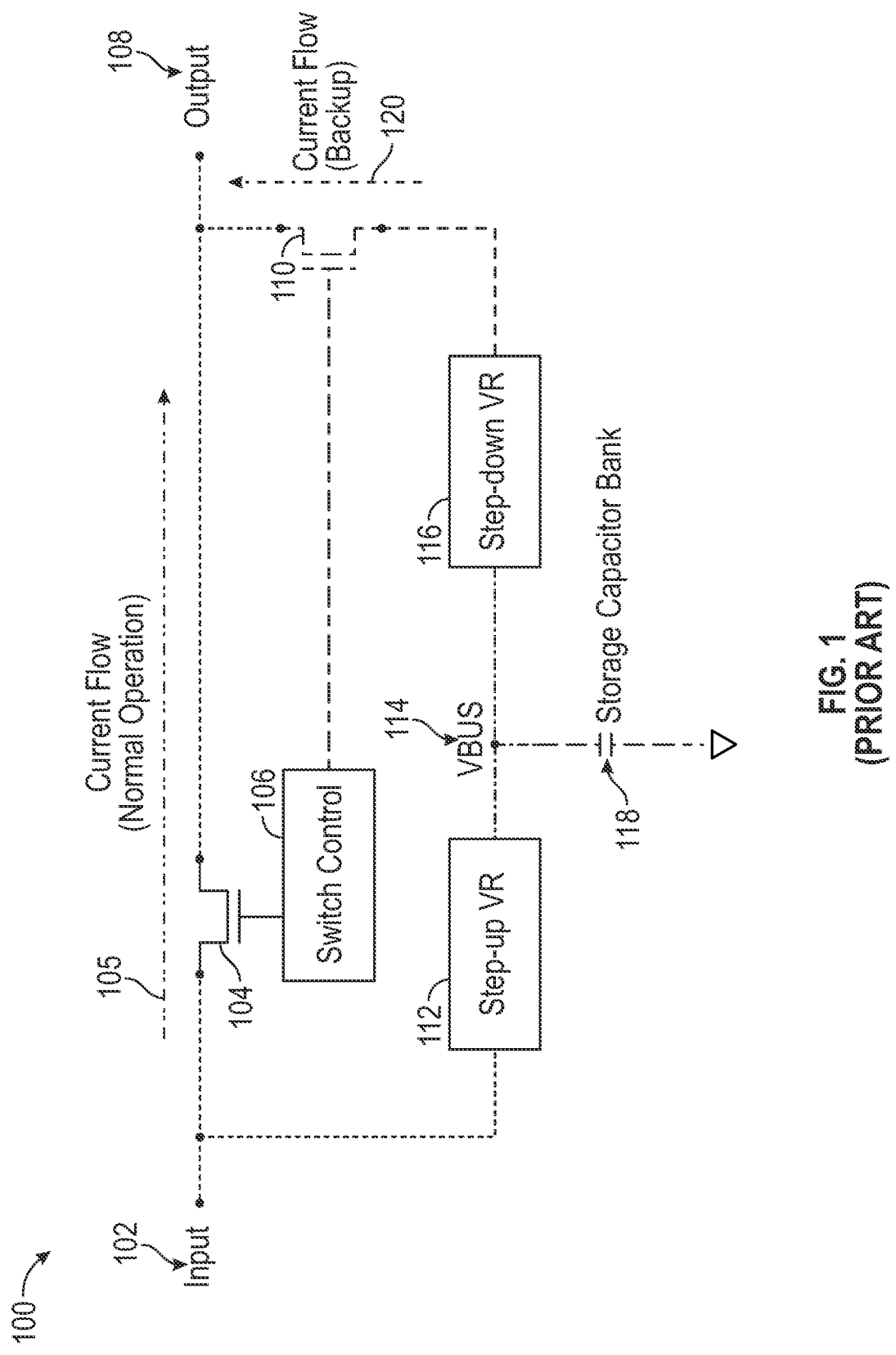
FIG. 1 shows an example of a conventional power backup circuit that includes an electrolytic capacitor bank with high voltage design.

FIG. 1 shows an example of a conventional power backup circuit 100 that includes an electrolytic capacitor bank 118 (hereafter referred to as "capacitor," as it may include one capacitor or a plurality of capacitors in parallel) with high voltage design. During normal operation, current 105 passes through MOSFET 104 to produce output 108. Switch control 106 controls the switching between normal operation and backup operation. When backup operation is required, switch control 106 turns off MOSFET 104 and turns on MOSFET 110. Capacitor bank 118 is charged prior to use of the backup mode using step-up VR module 112 so $V_{Bus}$ 114 may be a high voltage value relative to the output 108. Step-up VR module 112, also known as a boost converter, may step up a DC voltage from an input value to an output value. During backup operation, current is discharged from the capacitor 118 and the voltage is stepped down using step-down VR module 116 to produce current 120, which maintains the output 108 even in backup mode. Step-down VR module 116, also known as a buck converter, may step down a DC voltage from an input value to an output value. As stated above, a problem arises when the capacitor 118 suffers from degraded performance over time. This can result in a reduced current 120, thereby causing the output 108 to possibly not be adequate to support the load required.

Figure 2:
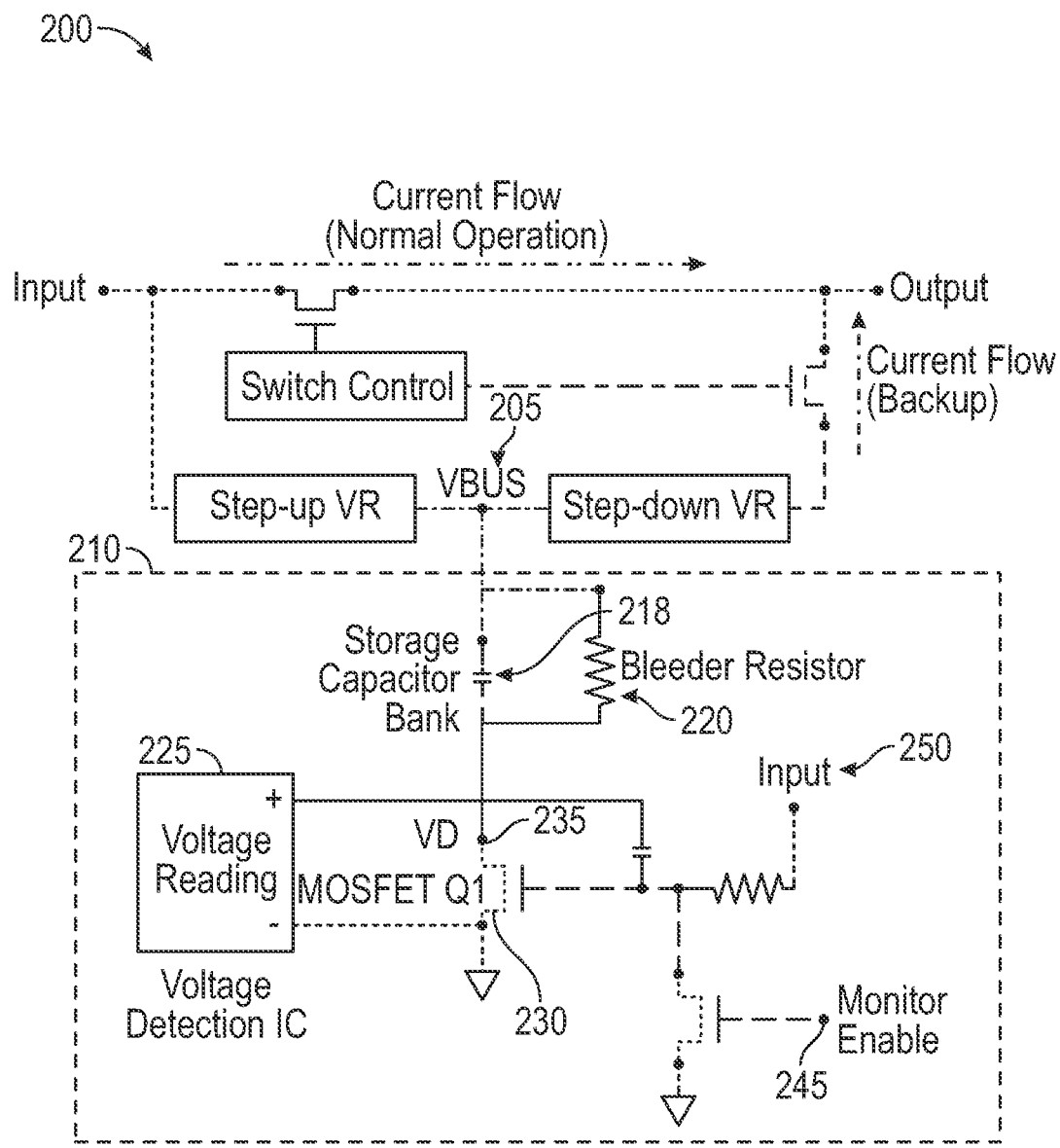
FIG. 2 shows an example of a power backup circuit that includes a capacitance-monitoring circuit, according to an embodiment.
Figure 3:
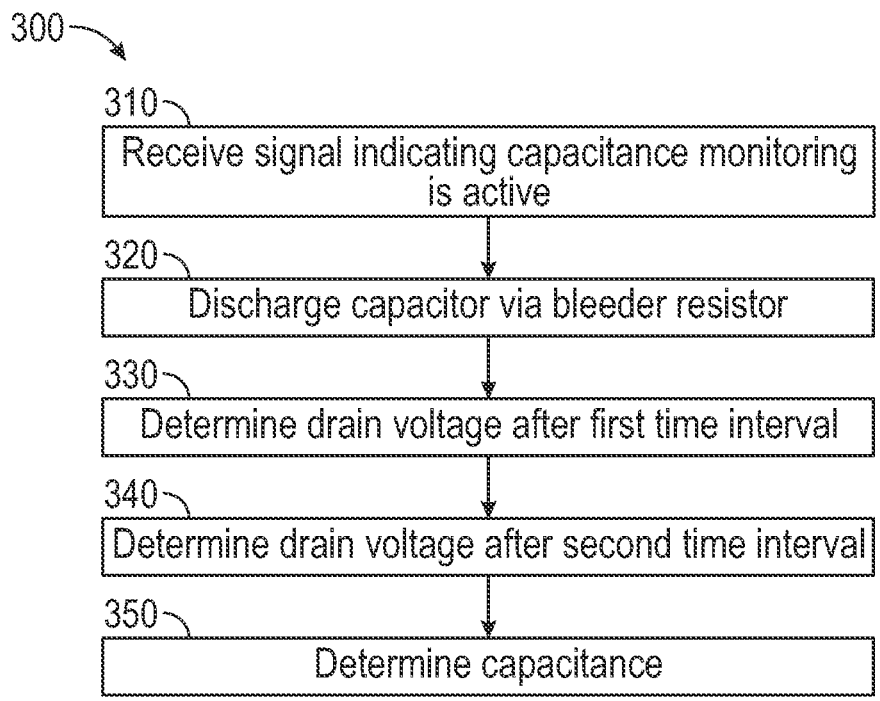
FIG. 3 shows a flow diagram for a method of monitoring capacitance of a power backup circuit capacitor, according to an embodiment.

The proposed solution uses a capacitance-monitoring circuit to periodically measure and report the capacitance of the capacitor 118, allowing for maintenance and/or replacement of capacitors before performance is required in the backup mode. FIG. 2 shows an example of a power backup circuit 200 that includes a capacitance-monitoring circuit 210, according to an embodiment. FIG. 3 shows a flow diagram for a method 300 of monitoring capacitance of a power backup circuit capacitor 218, according to an embodiment. In the example discussed in FIGS. 2 and 3, the capacitance-monitoring circuit includes MOSFET Q1 230, bleeder resistor 220, and voltage detection circuit 225. As shown in capacitance-monitoring circuit 210, the bleeder resistor may be coupled to both the high side and the low side of the capacitor 218. Both the bleeder resistor 220 and the low side of the capacitor 218 may be coupled to the drain of MOSFET Q1 230. Voltage detection IC 225 (also referred to herein as the voltage detection circuit) may be communicatively coupled to the drain and the source of MOSFET Q1 230. The gate of MOSFET Q1 230 may be coupled to the drain of second MOSFET 240, whose gate may receive control signals from control circuitry (not shown). Input voltage 250 may be used to turn MOSFET Q1 on as needed during the capacitance monitoring process, as described below.

Method 300 describes the capacitance monitoring and reporting process of backup circuit 200, according to an exemplary embodiment. At step 310, capacitance-monitoring circuit 210 receives a signal indicating that capacitance monitoring is active. The signal may be received, for example, at a "monitor enable" signal 245 at the gate of second MOSFET 240. In response to receiving the signal indicating that capacitance monitoring is active, the first MOSFET Q1 230 may be turned off at step 320, thereby causing the capacitor 218 to be discharged via bleeder resistor 220. The turning off of the first MOSFET Q1 230 may be performed by, for example second MOSFET 240 being turned on by the monitor enable signal 245 going high (e.g., caused by control circuitry, not shown in power backup circuit 200. In response to the second MOSFET 240 being turned on, the gate node of the first MOSFET 230 may be reduced below its gate-source threshold voltage, which turns off the first MOSFET Q1 230.

Figure 4:
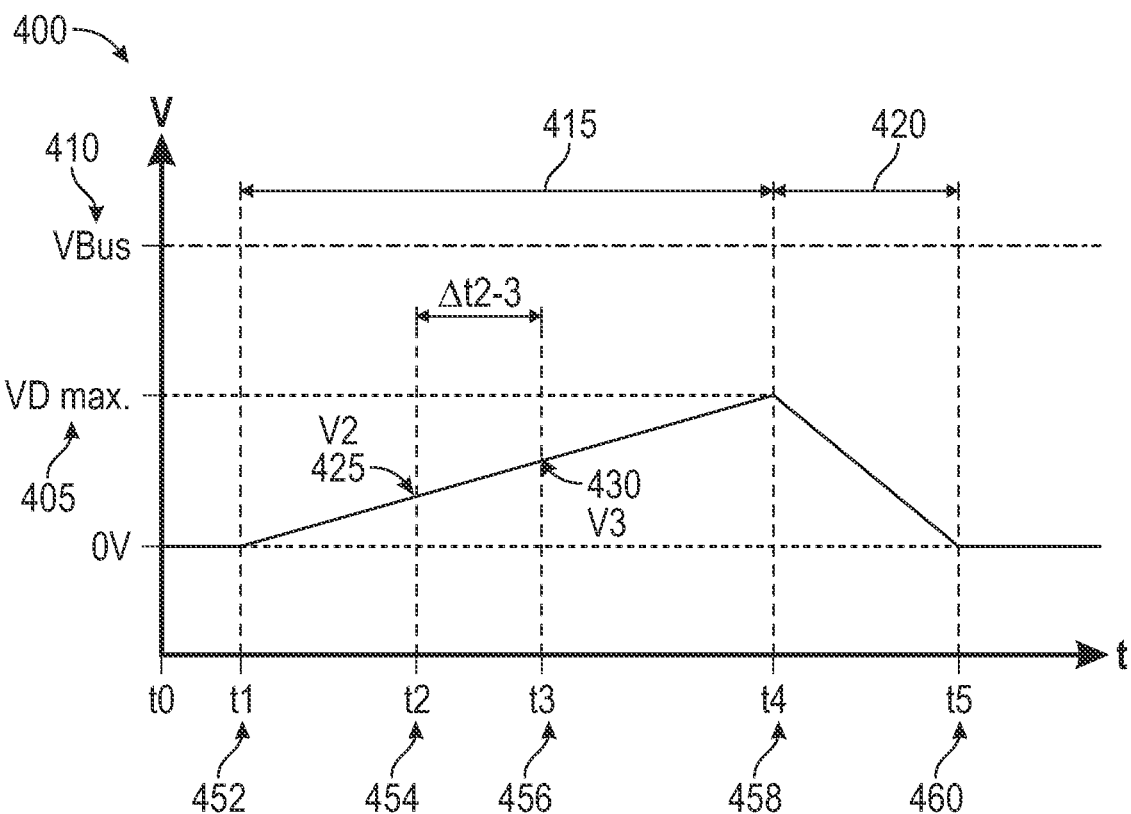
FIG. 4 shows a timing diagram for a capacitance monitoring process, according to an embodiment.

Discharging the capacitor 218 may cause the drain voltage $V_D$ 235 to increase. FIG. 4 shows a timing diagram 400 for a capacitance monitoring process, according to an embodiment. As shown in diagram 400, $V_{Bus}$ 410 (which corresponds to $V_{Bus}$ 205 in FIG. 2) is maintained at high voltage during capacitance monitoring (e.g., 50 V). Time point t1 452 corresponds to step 320. After a first time interval, the drain voltage VD 235 may be determined using the voltage detection circuit 225 at step 330 of method 300. This may be observed also in diagram 400, where $V_D$ increases from 0V to value $V_2$ 425 after the first time interval, at time point t2 454. Next, a second time interval is allowed to elapse, after which the drain voltage VD is determined again by the voltage detection circuit 225 at step 340. In diagram 400, the second time interval is reflected in the time between points t2 454 and t3 456, and the reading $V_3$ 430 is determined at step 340.

At step 350, the capacitance of the capacitor 218 may be determined using the voltage readings $V_2$ 425 and $V_3$ 430. The capacitance may be determined by the control circuitry (not shown) in communication with the second MOSFET 240. The control circuitry may be implemented using any suitable system controller, such as a baseboard management controller. The control circuitry may receive voltage reading data from the voltage detection circuit 225 via an inter-integrated circuit bus, and perform the calculations to determine the capacitance of the capacitor 218. In an exemplary embodiment, the following expressions may be used to determine the capacitance of capacitor 218.

Capacitance=$(I*\Delta t)/\Delta V$

Where:

$I=[V_{bus}-V_2-(V_3-V_2)/2]/R_{bleeder}$ $\Delta t = t3-t2$ $\Delta V = V_3 - V_2$ In other words, I represents a current passing through the capacitor during the second time interval, $\Delta t$ represents a length of the second time interval, and $\Delta V$ represents a difference between the second drain voltage, and the first drain voltage.

After the predetermined second time interval, a signal may be received indicating that the monitoring is disabled. In response to receiving the signal indicating that monitoring is disabled, the first MOSFET Q1 230 may be turned back on, which causes the capacitor 218 to be charged. In diagram 400, MOSFET Q1 230 is turned back on at time t4 458, when the drain voltage $V_D$ 235 of MOSFET Q1 230 is at its maximum value 405. Turning MOSFET Q1 230 back on causes the capacitor 218 to be charged in time interval 420, and the drain voltage $V_D$ 235 to decrease back to zero at point t5 460.

Figures 5, 6:
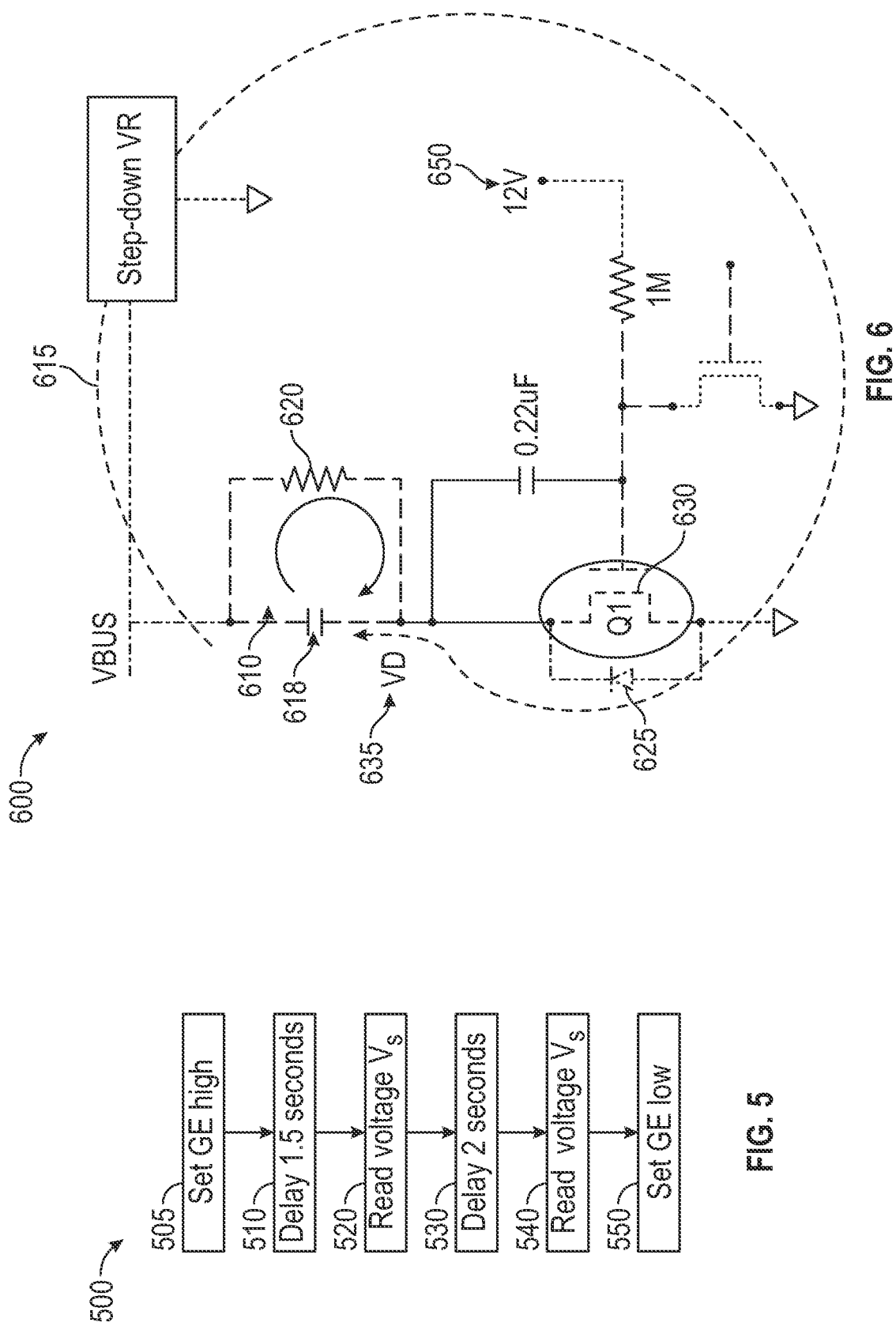
FIG. 5 shows a flow diagram for a method of controlling a capacitance-monitoring process using a control chip, according to an embodiment.
FIG. 6 shows an example of a power backup circuit that includes a capacitance-monitoring circuit that includes a backup mode during monitoring, according to an embodiment.

As stated above, a control chip may be used to transmit control signals (e.g., start capacitance monitoring, stop capacitance monitoring, etc.) to the capacitance-monitoring circuit 210 via second MOSFET 240. FIG. 5 shows a flow diagram for a method 500 of controlling a capacitance-monitoring process using a control chip. The steps shown in method 500 may be executed using the firmware of the control chip, for example. At step 505, capacitance monitoring is started by setting the monitor enable signal 245 to high. The monitor enable signal 245 may be triggered by the system control circuitry, as described above. At step 510 the first predetermined time interval is executed by delaying for 1.5 seconds. Then, at step 520, a control signal to determine the drain-source voltage $V_D$ is transmitted. After the second predetermined time interval is executed at step 530, another control signal is transmitted to read the voltage $V_S$ at step 540. Finally, as described above, the GE may be set to low by transmitting a control signal at step 550, ending the capacitance-monitoring process.

After the capacitance has been determined by the control circuitry, a report may also be generated by the control circuitry. The report may be generated, for example, by BMC "Baseboard management controller," which, as described above, may read the voltages, calculate the capacitance, and then output a numeric value to represent capacitance. The numeric value may be included in a report, which may be a filed and stored in a computing system if needing.

Figure 7:
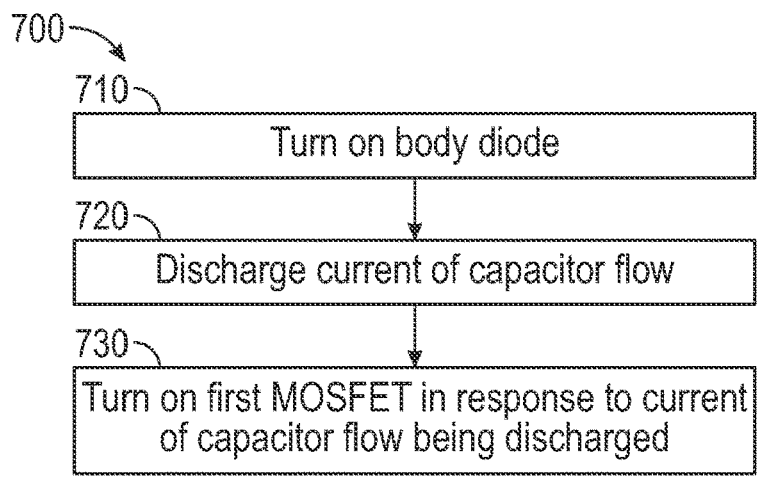
FIG. 7 shows a flow diagram for a method of turning off capacitance monitoring and activating a backup mode, according to an embodiment.

In addition to the foregoing, several other features may optionally be implemented using the capacitance-monitoring systems described herein. For example, a backup mode may be implemented so back up services may be fully provided by the power backup circuit even during capacitance monitoring. FIG. 6 shows an example of a capacitance-monitoring circuit 600 that includes a backup mode during monitoring, according to an embodiment. FIG. 7 shows a flow diagram for a method 700 of turning off capacitance monitoring and activating a backup mode, according to an embodiment. If an input power loss (e.g.. input power 102 is reduced) event occurs during capacitance monitoring (e.g., at any time between t0 and t4 in diagram 400), capacitance monitoring is stopped immediately. In response to the power loss event, the step-up VR 112 turns off and the step-down VR 116 begins to step-down from the $V_{Bus}$ 114 voltage to the output voltage 108 to supply the power for system buck up. During this period, $V_{Bus}$ 114 is decreasing and the capacitor 618 is starting to discharge. Discharge of capacitor 618 may continue until $V_D$ 635 falls below the ground voltage (usually 0V). Body diode 625 of first MOSFET Q1 630 is turned on at step 710, generally within a few nanoseconds of the event. The body diode 625 being turned on may then cause the current 615 passing through the capacitor 618 to be discharged at step 720. This translates into the current passing back through the step-down VR, instead of the current 610 passing through bleeder resistor 620 as is done during capacitance monitoring.

Until the voltage across body diode 625 of first MOSFET Q1 630 exceeds the forward voltage of the first MOSFET Q1 630, the discharging current 615 flows through the body diode 625. The discharge takes place until at step 730 the first MOSFET Q1 630 is turned on when discharge is complete. At this point, the power backup circuit is fully on backup mode, and the capacitor 618 releases enough energy to meet the output requirement (e.g., 120 W/30 mS). This output takes place until the capacitor 618 is fully drained, at which point the capacitor 618 is recharged using its initial charging process if the power source is on again.

Figure 8:
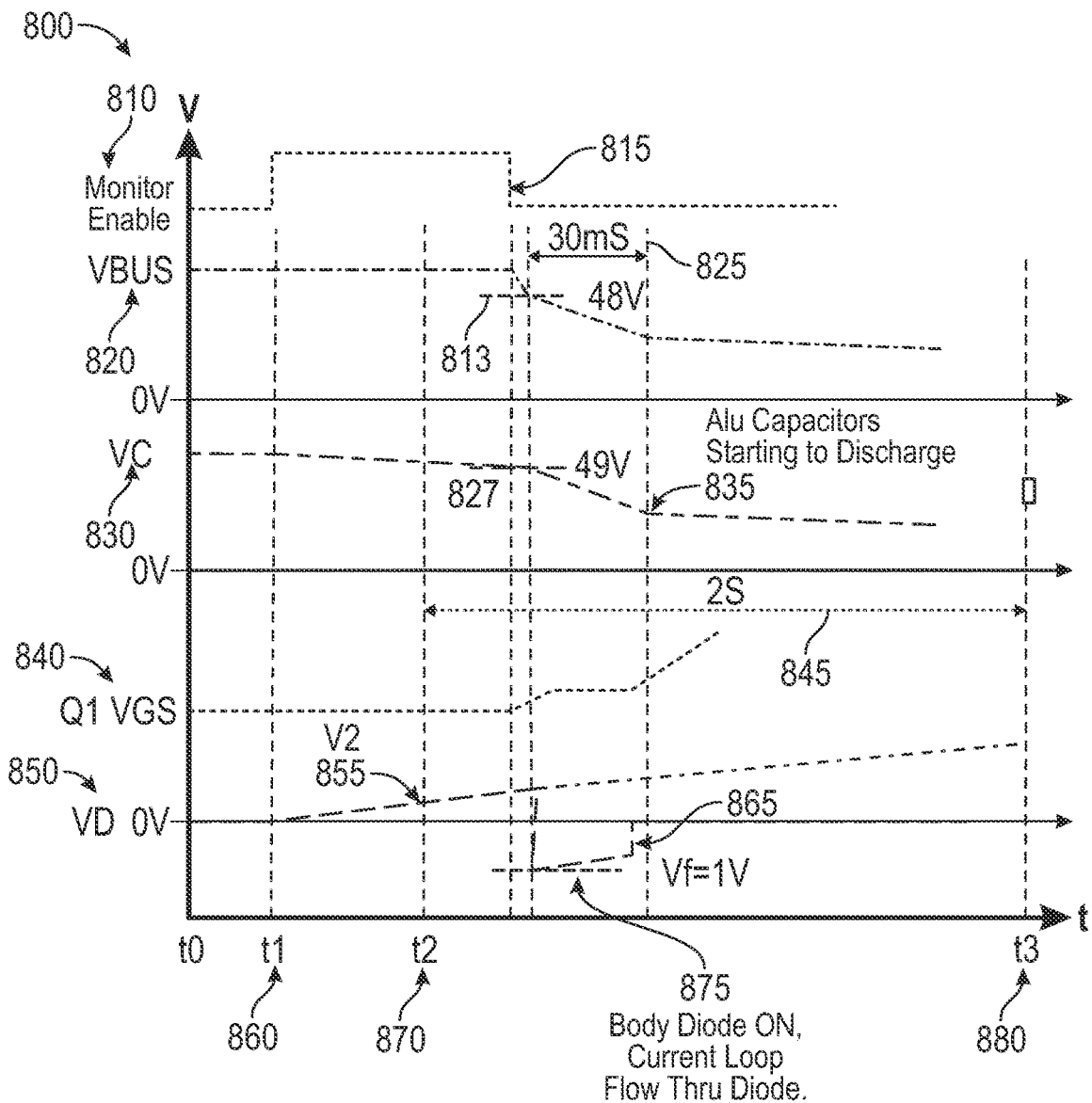
FIG. 8 shows a timing diagram for turning off capacitance monitoring and activating a backup mode, according to an embodiment.

FIG. 8 shows a timing diagram 800 for turning off capacitance monitoring and activating a backup mode, where the timing of the discharge process may be observed. Monitor enable signal, received at the gate of the second MOSFET, remains high until the power loss event occurs at time point 815 (between t2 870 and t3 880, during the second predetermined time interval 845, which is 2 seconds in the exemplary embodiment), at which point backup mode is enabled and capacitance monitoring is stopped. After the brief delay illustrated after the power loss event, the body diode 625 is turned on using an activation Vf of 1V at 875. The drain voltage $V_D$ 635 is represented as curve 850, and during the brief hold-up time 825 shifts to a negative value before operating in backup mode and returning to 0V when the MOSFET Q1 is turned on. The turning-on of MOSFET Q1 630 is illustrated by the gate-source voltage 840 of MOSFET Q1 630 starting at 0V when turned off, then increasing after the power loss event 815 until the activation voltage of the MOSFET Q1 630 is reached during the hold-up time 825 (at which point the MOSFET Q1 630 is turned on).

Also, during hold-up time 825, the capacitor 618 voltage Vc starts to discharge, with a starting value of $V_{bus}$-$V_D$ (for the MOSFET Q1 630). In the exemplary embodiment, $V_{Bus}$ 820 has a value of 50V prior to power loss event 815, thereby causing the start value 827 for Vc to be 49V as shown. Likewise, after the body diode 625 is turned on, $V_{Bus}$ 820 is reduced to 48V, based on $V_{Bus}$ 820 being equal to the sum of Vc and $V_D$ 635 (which has a value of −1V as shown by curve 850). $V_{BUS}$ 850 is also discharged as shown during backup mode, providing the energy to supply the backup output requirement as previously discussed.

Figure 9A:
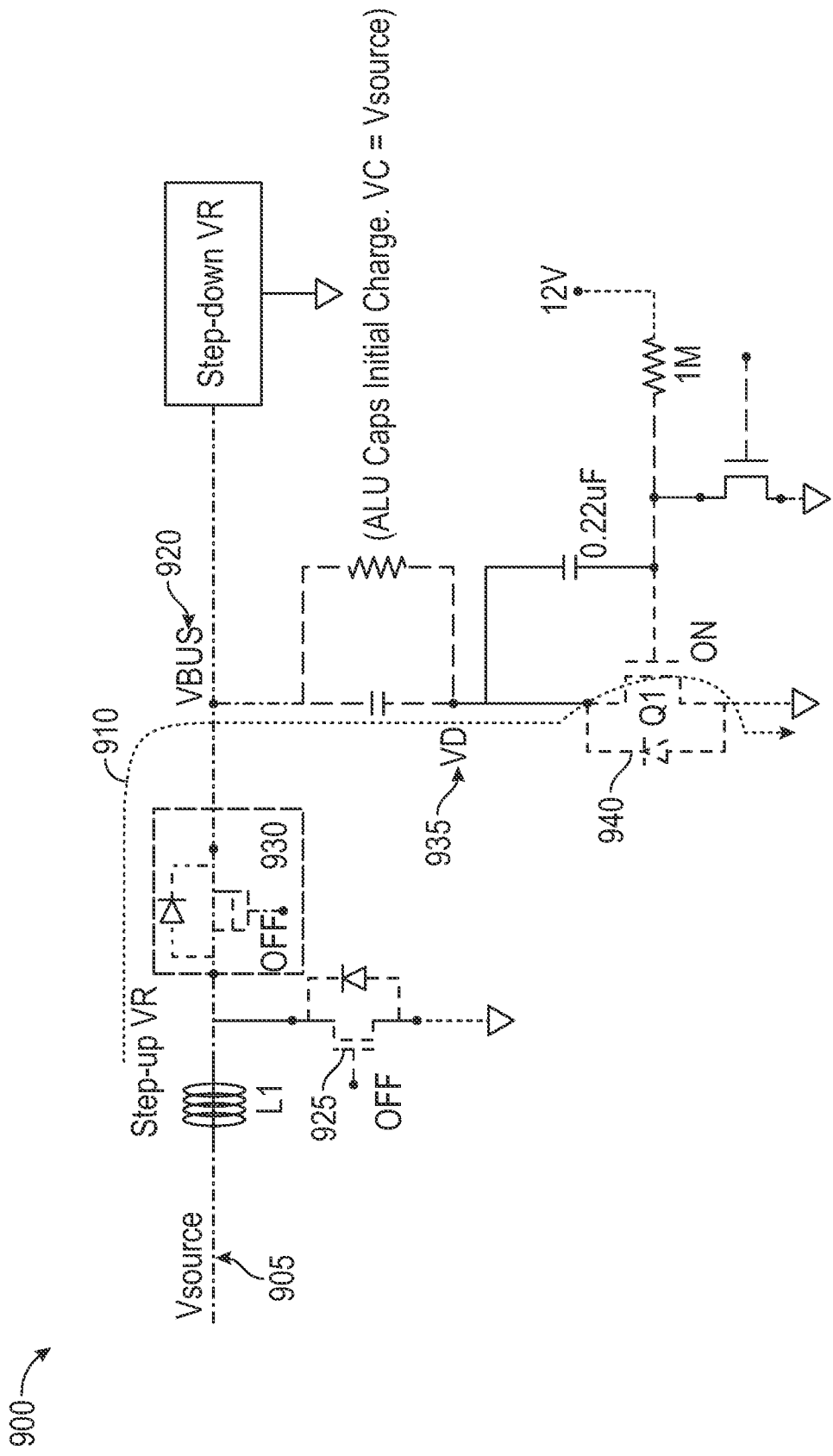
FIGS. 9A-B show examples of a power backup circuit during initial charging of a capacitor of the power backup circuit, according to an embodiment.
Figure 9B:
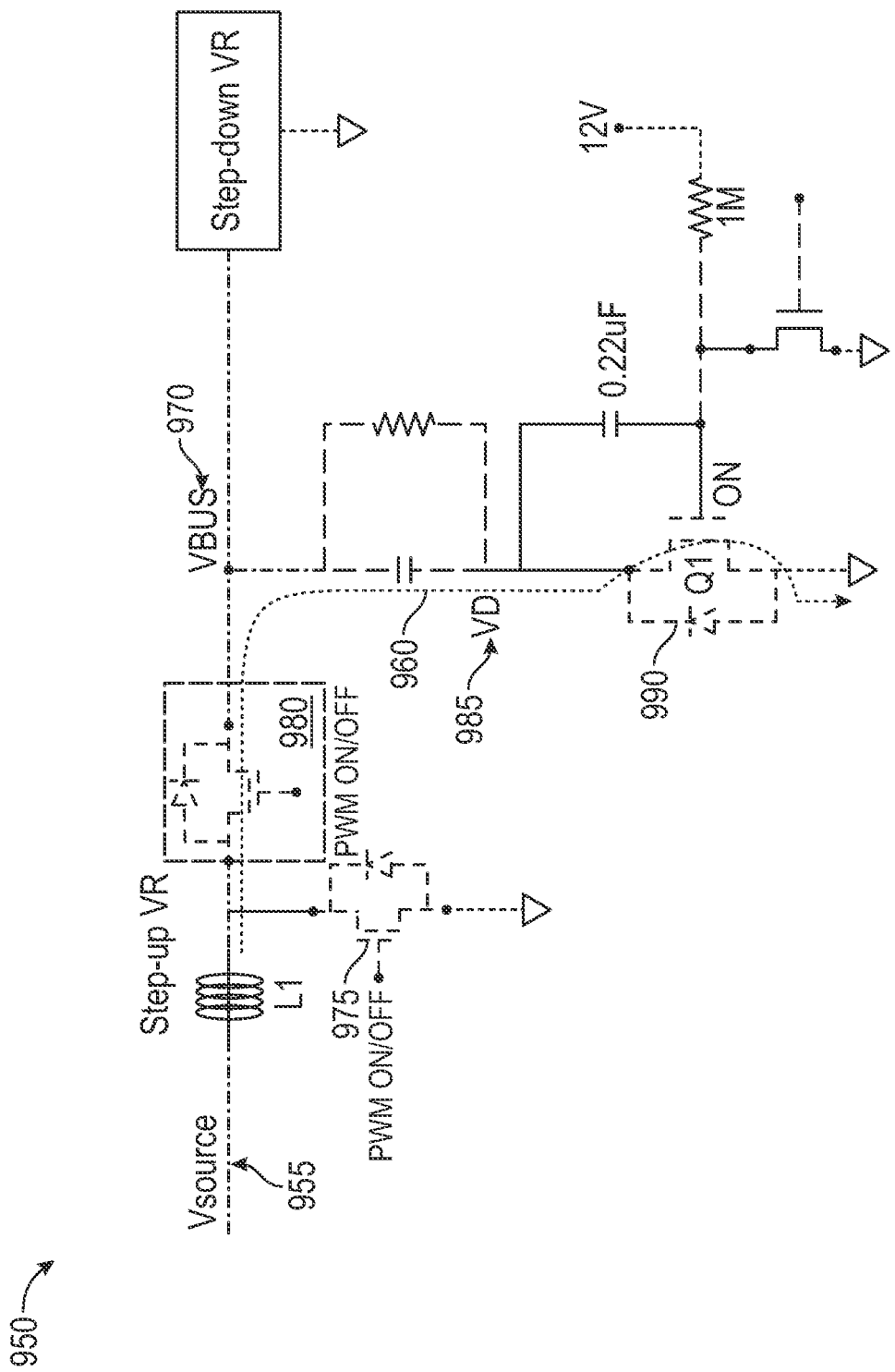
Figure 10:
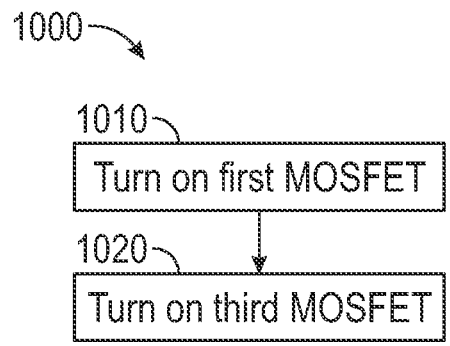
FIG. 10 shows a flow diagram for a method of charging the capacitor of the power backup circuit, according to an embodiment.

Another feature that may be provided using the capacitance monitoring circuits described herein is a soft start for the power backup circuit. Soft start is a feature of VR that provides the voltage $V_{Bus}$ with a smooth and slower ramp-up during initial charging. FIGS. 9A-B show an example of power backup circuits 900 and 950 that provide a soft start during initial charging of the capacitor of the power backup circuit. FIG. 10 shows a flow diagram for a method 1000 of charging the capacitor using a soft start, according to an embodiment. As shown in power backup circuit 900, the step-up VR module of the power backup circuit (such as step-up VR module 112) may include inductor L, fourth MOSFET 925, and third MOSFET 930 (which includes a body diode as shown). The soft start process 1000 may be started by turning on the first MOSFET 990 using the 12V input voltage. Since third MOSFET 930 and fourth MOSFET 925 are off, $V_{Bus}$ 920 is not charged by the high voltage of the power source VSource, and instead is ramped up based on the capacitor voltage Vc, which is equal to the source voltage of the first MOSFET 990 (e.g., 12V), via current 910 during a first charging period. In an exemplary embodiment, $V_{Bus}$ 920 is equal to the sum of Vc and the activation voltage for the body diode for the first MOSFET 990 (which may be −1V, similarly to the body diode described previously for first MOSFET Q1).

The soft start process 1000 may continue by turning on third MOSFET 980 and fourth MOSFET 975, thereby activating the step-up VR module of circuit 950 (which may be controlled by pulse width modulation as shown). During this second charging period, $V_{Bus}$ 970 is increased to the high voltage value provided by the power source VSource (e.g., 50V). Accordingly, the capacitor voltage Vc is increased until it reaches full charge equal to $V_{Bus}$ 970 using current 960.

Figure 11:
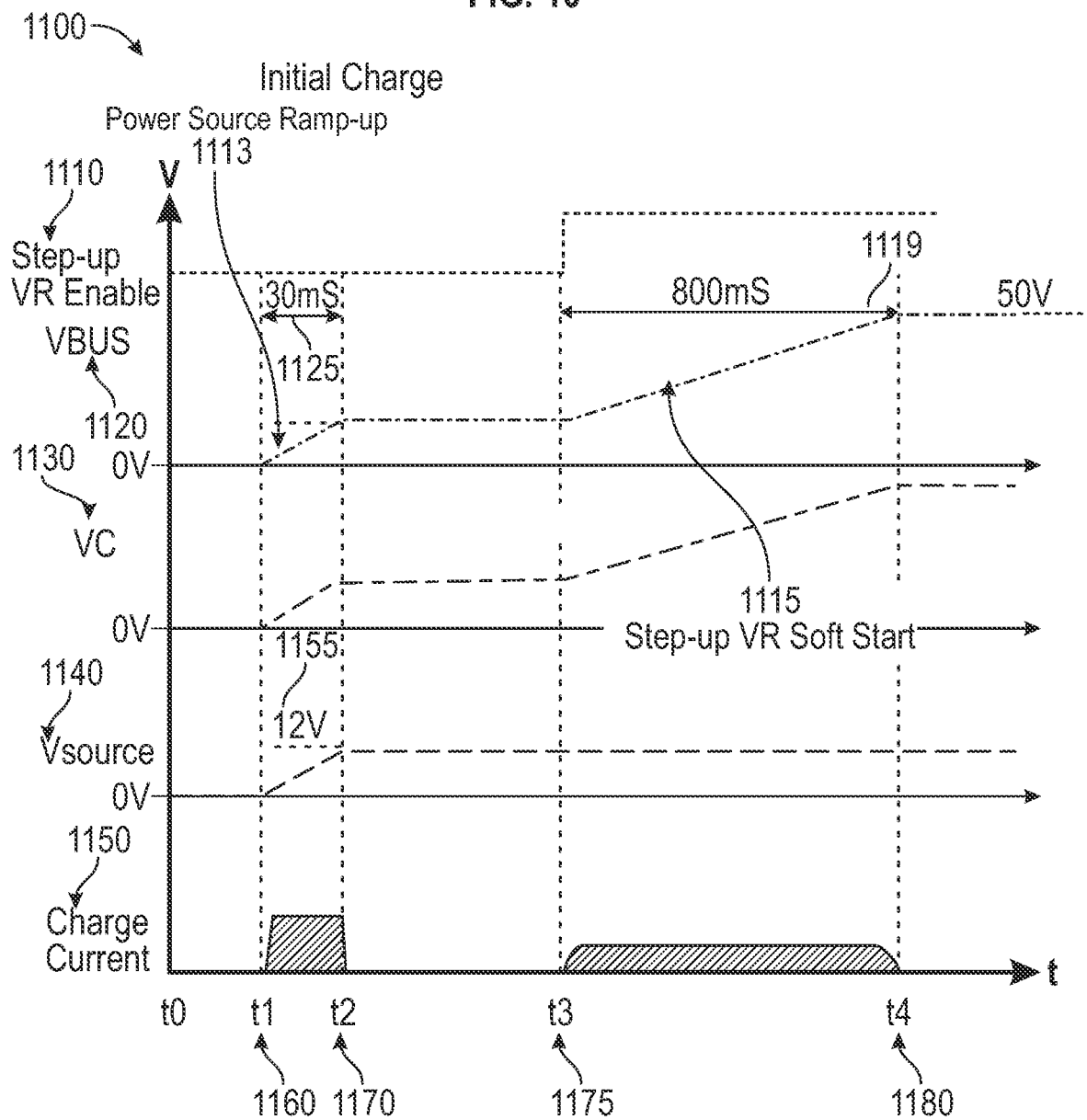
FIG. 11 shows a timing diagram for initial charging of the capacitor of the power backup circuit, according to an embodiment.

FIG. 11 shows a timing diagram 1100 for soft start charging of the capacitor of a power backup circuit, where the timing of the charging process may be observed. During period t0 to t3 1175, the step-up VR module is off, so the capacitor is not charged by the power source voltage Vsource. Instead, during first charging period 1125, the source voltage of first MOSFET Q1 990 is increased to 12V to turn on the first MOSFET Q1 990 between time points t1 1160 and t2 1170. This causes the capacitor voltage Vc 1130 to increase to 12V as well via charge current 1150 (corresponding to charge current 910 from circuit 900) and $V_{Bus}$ 1120 to increase to 11V as described above. At t3 1175, the step-up VR module is turned on, as reflected by step-up VR enable control signal 110 going from low value 1113 to high value 1115. During second charging period 1119, $V_{Bus}$ 1120 and Vc 1130 are gradually increased between time points t3 1175 and t4 1180 to their full charge of 50V using current 1150 (corresponding to current 960 in circuit 950).

It should be understood that the arrangement of the circuits illustrated in FIGS. 2, 6, and 9A-B are only possible implementations and that other arrangements are possible. It should also be understood that the various system components (and means) defined by the claims, described above, and illustrated in the various block diagrams represent logical components that are configured to perform the functionality described herein. In addition, while at least one of these components are implemented at least partially as an electronic hardware component, and therefore constitutes a machine, the other components may be implemented in software, hardware, or a combination of software and hardware. More particularly, at least one component defined by the claims may be implemented at least partially as an electronic hardware component, such as an instruction execution machine (e.g., a processor-based or processor-containing machine) and/or as specialized circuits or circuitry (e.g., discrete logic gates interconnected to perform a specialized function), such as those illustrated in FIGS. 4 and 6. Other components may be implemented in software, hardware, or a combination of software and hardware. Moreover, some or all of these other components may be combined, some may be omitted altogether, and additional components can be added while still achieving the functionality described herein. Thus, the subject matter described herein can be embodied in many different variations, and all such variations are contemplated to be within the scope of what is claimed.

In the description above, the subject matter may be described with reference to acts and symbolic representations of operations that are performed by one or more devices, unless indicated otherwise. As such, it will be understood that such acts and operations, which are at times referred to as being computer-executed, include the manipulation by the processing unit of data in a structured form. This manipulation transforms the data or maintains it at locations in the memory system of the computer, which reconfigures or otherwise alters the operation of the device in a manner well understood by those skilled in the art. The data structures where data is maintained are physical locations of the memory that have particular properties defined by the format of the data. However, while the subject matter is being described in the foregoing context, it is not meant to be limiting as those of skill in the art will appreciate that various of the acts and operation described hereinafter may also be implemented in hardware.

For purposes of the present description, the terms "component," "module," and "process," may be used interchangeably to refer to a processing unit that performs a particular function and that may be implemented through computer program code (software), digital or analog circuitry, computer firmware, or any combination thereof.

It should be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

In the description above and throughout, numerous specific details are set forth in order to provide a thorough understanding of the disclosure. It will be evident, however, to one of ordinary skill in the art, that the disclosure may be practiced without these specific details. In other instances, well-known structures and devices are shown in block diagram form to facilitate explanation. The description of the preferred an embodiment is not intended to limit the scope of the claims appended hereto. Further, in the methods disclosed herein, various steps are disclosed illustrating some of the functions of the disclosure. One will appreciate that these steps are merely exemplary and are not meant to be limiting in any way. Other steps and functions may be contemplated without departing from this disclosure.

What is claimed is:

1. A method for reporting capacitance of a capacitor of a power backup circuit, the method comprising:
    receiving, by a capacitance-monitoring circuit, a signal indicating that monitoring is active, the capacitance-monitoring circuit comprising a first metal-oxide-semiconductor field-effect transistors (MOSFET), which is communicatively coupled to the capacitor, a bleeder resistor communicatively coupled to the first MOSFET, and a voltage detection circuit, which is also communicatively coupled to the first MOSFET;
    in response to receiving the signal indicating that monitoring is active, turning off the first MOSFET, which causes the capacitor to be discharged via the bleeder resistor;
    after a predetermined first time interval, determining a first drain voltage of the first MOSFET using the voltage detection circuit;
    after a predetermined second time interval, determining a second drain voltage of the first MOSFET using the voltage detection circuit;
    determine a capacitance of the capacitor based on the first drain voltage and the second drain voltage; and
    transmit a report that includes the determined capacitance.

2. The method of claim 1, where the capacitance-monitoring circuit further comprises a second MOSFET communicatively coupled to the gate of the first MOSFET and communicatively coupled to a control circuit, the signal indicating that monitoring is active being received from the second MOSFET.

3. The method of claim 1, the capacitance being determined using the formula:
    Capacitance=$(I*\Delta t)/\Delta V$, where I represents a current passing through the capacitor during the second time interval, $\Delta t$ represents a length of the second time interval, and $\Delta V$ represents a difference between the second drain voltage, and the first drain voltage.

4. The method of claim 1, further comprising:
    receiving, at the gate of the second MOSFET after the predetermined second time interval, a signal indicating that monitoring is disabled; and
    in response to receiving the signal indicating that monitoring is disabled, turning on the first MOSFET, which causes the capacitor to be charged.

5. The method of claim 1, further comprising, in response to receiving a signal indicating a power loss event after the receiving the signal indicating that monitoring is active:
    turning on a body diode communicatively coupled to the first MOSFET, which remains off;
    discharging, by the body diode, a current of capacitor flow active during capacitance monitoring; and
    turning on the first MOSFET in response to the current of capacitor flow being fully discharged.

6. The method of claim 1, further comprising, prior to the receiving the signal indicating that monitoring is active, charging the capacitor of the power backup circuit by:
    turning on the first MOSFET, thereby causing a voltage on a high side of the capacitor to be ramped up to a source voltage; and
    turning on a third MOSFET, thereby causing the voltage on the high side of the capacitor to be ramped up to a target voltage for power backup.

7. The method of claim 1, the capacitor being an aluminum electrolytic capacitor.

8. A power backup circuit comprising:
    a bleeder resistor coupled to each of a high side and a low side of a capacitor;
    a first and second metal-oxide-semiconductor field-effect transistor (MOSFET), each MOSFET comprising a source, a drain, and a gate, the MOSFETs being coupled such that the drain of the second MOSFET is communicatively coupled to the gate of the first MOSFET, and the drain of the first MOSFET is communicatively coupled to the bleeder resistor; and a voltage detection circuit communicatively coupled to both the drain and the source of the first MOSFET, where, in response to receiving a signal at the gate of the second MOSFET indicating monitoring is active:
- the first MOSFET is turned off, thereby causing the capacitor to be discharged via the bleeder resistor;
- a first drain voltage of the first MOSFET is determined using the voltage detection circuit after a predetermined first time interval;
- a second drain voltage of the first MOSFET is determined using the voltage detection circuit after a predetermine second time interval;
- a capacitance of the capacitor is determined based on the first drain voltage and the second drain voltage; and
- a report is generated and transmitted that includes the determined capacitance.

9. The power backup circuit of claim 8, where the signal at the gate of the second MOSFET is received from a control chip, which also transmits signals to determine the first and second drain voltages after the predetermined first and second time intervals respectively.

10. The power backup circuit of claim 8, the capacitance being determined using the formula: Capacitance=$(I*\Delta t)/\Delta V$, where I represents a current passing through the capacitor during the second time interval, $\Delta t$ represents a length of the second time interval, and $\Delta V$ represents a difference between the second drain voltage, and the first drain voltage.

11. The power backup circuit of claim 8, where, after the predetermined second time interval, a signal indicating that monitoring is disabled is received at the gate of the second MOSFET, and, in response to receiving the signal indicating that monitoring is disabled, the first MOSFET is turned on, thereby causing the capacitor to be charged.

12. The power backup circuit of claim 8, where, in response to receiving a signal at the gate of the second MOSFET indicating a power loss event after the receiving the signal indicating that monitoring is active:
- a body diode communicatively coupled to the first MOSFET, which remains off, is turned on;
- a current of capacitor flow active during capacitance monitoring is discharged by the body diode; and
- the first MOSFET is turned on in response to the current of capacitor flow being fully discharged.

13. The power backup circuit of claim 8, where, prior to the receiving the signal indicating that monitoring is active, the capacitor is charged by:
- turning on the first MOSFET, thereby causing a voltage on a high side of the capacitor to be ramped up to a source voltage; and
- turning on a third MOSFET, thereby causing the voltage on the high side of the capacitor to be ramped up to a target voltage for power backup.

14. The power backup circuit of claim 8, the capacitor being an aluminum electrolytic capacitor.

* * * * *